United States Patent [19]
Lavieville et al.

[11] Patent Number: 5,764,088
[45] Date of Patent: Jun. 9, 1998

[54] CONTROL CIRCUIT FOR AN ELECTRONIC SWITCH, AND A SWITCH CONSTITUTING AN APPLICATION THEREOF

[75] Inventors: Jean-Paul Lavieville; Didier Muller, both of Gif Sur Yvette, France

[73] Assignee: Alcatel Alsthom Compagnie Generale D'Electricite, Paris Cedex, France

[21] Appl. No.: 948,489

[22] Filed: Oct. 10, 1997

Related U.S. Application Data

[63] Continuation of Ser. No. 569,289, Dec. 8, 1995, abandoned.

[30] Foreign Application Priority Data

Dec. 9, 1994 [FR] France ............................ 94 14822

[51] Int. Cl.$^6$ ............................ H03K 17/08; H02H 3/20
[52] U.S. Cl. ............................ 327/110; 327/312; 327/389; 361/56; 361/191; 361/111
[58] Field of Search ............................ 327/110, 312, 327/314, 323, 325, 310, 313, 384, 389, 379; 361/18, 56, 58, 91, 111, 119

[56] References Cited

U.S. PATENT DOCUMENTS

| | | | |
|---|---|---|---|
| 4,355,341 | 10/1982 | Kaplan | 330/207 |
| 4,588,904 | 5/1986 | Glogolja | 327/484 |
| 4,949,213 | 8/1990 | Sasagawa et al. | 327/109 |
| 5,210,479 | 5/1993 | Kimura et al. | 327/108 |
| 5,347,169 | 9/1994 | Preslar et al. | 327/110 |
| 5,581,432 | 12/1996 | Wellnitz et al. | 361/56 |
| 5,587,865 | 12/1996 | Bielig et al. | 361/91 |

FOREIGN PATENT DOCUMENTS

0581110A2  2/1994  European Pat. Off. .

*Primary Examiner*—Timothy Callahan
*Assistant Examiner*—Terry L. Englund
*Attorney, Agent, or Firm*—Sughrue, Mion, Zinn, Macpeak & Seas, PLLC

[57] ABSTRACT

The control path of the switch (I) comprises an input stage (T2, T1) having an input (H) coupled to the input (E) for the control signal and having its output coupled to the control electrode (G) of the switch (I). A protection circuit (D1, Z2) coupled between the load (C) and the control path includes a threshold effect component (Z2) and a decoupling element (D1). On being made conductive by the current that results from a surge generated in a circuit of the load (C), the protection circuit (D1, Z2) is coupled to the input (H) of said input stage (T2, T1) to act on said switch (I) in the same way as a control signal for the switch (I). In this manner, the control path prevents current in the load (C) from dropping off suddenly.

2 Claims, 1 Drawing Sheet

5,764,088

1

CONTROL CIRCUIT FOR AN ELECTRONIC SWITCH, AND A SWITCH CONSTITUTING AN APPLICATION THEREOF

This is a continuation of application Ser. No. 08/569,289 filed Dec. 8, 1995, now abandoned.

BACKGROUND OF THE INVENTION

The present invention relates to a control circuit for an electronic switch, and to an electronic switch provided with such a control circuit.

It is well known that when an electronic switch which controls power to an inductive load is turned off and the power supply of the Load is open circuit, the switch is subjected to a surge that risks damaging it.

A solution to this problem is found in the article "The benefits of integration" by A. Alderman, published in "PCIM Europe", November/December 1993. That solution is shown in FIG. 1.

In this figure, the control input E of the switch is connected via an input matching resistor R1 to the grids of two field-effect transistors C1 and C2 constituting a push-pull type input stage. These two transistors are connected in series between ground and a DC bias source derived from the positive power supply VCC via a limiting resistor R2 and a zener diode Z1 with a 10 V threshold voltage. The common point between the two transistors of this input stage delivers either the 10 V voltage developed across the terminals of the zener diode Z1, or else ground voltage (ignoring the transistor threshold voltages) when the state of the input E is such that either the transistor C1 or else the transistor C2 is saturated. The voltage at this common point is made available at a point G after being divided by a bridge constituted by resistors R3 and R4, and it controls the grid of the switch I which is thus either saturated or blocked, and which feeds power to the load C when saturated. When the switch I is blocked, the load C which is always more or less inductive, develops a surge on the drain of the switch I. To prevent such a surge damaging the switch, a protection circuit is also provided which is constituted by a zener diode Z2 in series with a diode D1 and which is connected between the point D, i.e. the drain of the switch I, and the point G, i.e. its grid. In FIG. 1, the zener diode Z2 has a threshold of 50 V, for example. The diode D1 is blocked when the switch is controlled so as to conduct. It becomes conductive when a surge exceeds the 50 V conductivity threshold of the zener diode Z2 (plus its own threshold), and the resulting current flows via the resistor R3 and the transistor C2. The parallel-connected resistor R4 may be of comparatively greater resistance so as to play a negligible role in this case. As soon as the potential on the grid is sufficient, the switch I unblocks and the current flowing through it limits the surge.

When the protection circuit operates in the presence of a surge, the current flowing in Z2, D1, R3, and C2 must not exceed a specified value so as to avoid running the risk of damaging the elements of this circuit. In contrast, the resistance of the resistor R3 must be such that a voltage is obtained which is sufficient to make the switch I conduct but without risking damage thereto. This defines a desirable resistance for the resistor R3. There is no reason why this should be exactly the same as the resistance required by the control circuit for turning on the switch I, as defined above. As a result, the resistance of resistor R3 is generally a compromise, but cases exist (need to obtain steep conduction fronts, and thus high surges) where such a compromise is far from satisfactory, or is even impossible, which makes it necessary to use components (Z2, D1, R3, C2) capable of withstanding relatively high current, so much so that they can no longer be integrated on the same chip as the switch, thus increasing the cost of the switch and control circuit assembly.

SUMMARY OF THE INVENTION

The present invention provides a solution to the above problem.

An object of the invention is thus a control circuit for an electronic switch in which the circuit for protection against surges has a negligible effect only on the normal operating conditions of the control circuit for the switch, and includes only components that, in the presence of a surge, dissipate sufficiently little energy to be suitable for being integrated.

This object is achieved in a control circuit for an electronic switch powering a load, the control circuit comprising a control path for the switch that extends from a control signal input to the control electrode of the switch, said control path comprising a push-pull input stage whose input is coupled to said control signal input, and whose output is coupled to the control electrode of the electronic switch, and also comprising a protection circuit inserted between said load and said control path, which protection circuit comprises a threshold effect component and a decoupling element, and is made conductive by the current which results from a surge generated in the circuit of said load. According to the invention, said protection circuit is coupled to the input of said input stage so as to act on said switch in the same way as a control signal for the switch.

As a result, the surge no longer controls the switch directly but it controls the input stage that controls the switch in turn, thereby practically eliminating the constraints concerning the current generated by the surge.

Preferably, said input of the input stage comprises an impedance whose value is such that it protects the elements of the protection circuit.

This impedance is simple to determine because it can be high and consequently its influence is negligible on the operating characteristics of the control circuit of the switch.

BRIEF DESCRIPTION OF THE DRAWINGS

The various objects and characteristics of the present invention appear more clearly from the following description of an embodiment of the invention given by way of non-limiting example and with reference to the accompanying figures, in which.

DETAILED DESCRIPTION OF A PREFERRED EMBODIMENT

Figure 1:
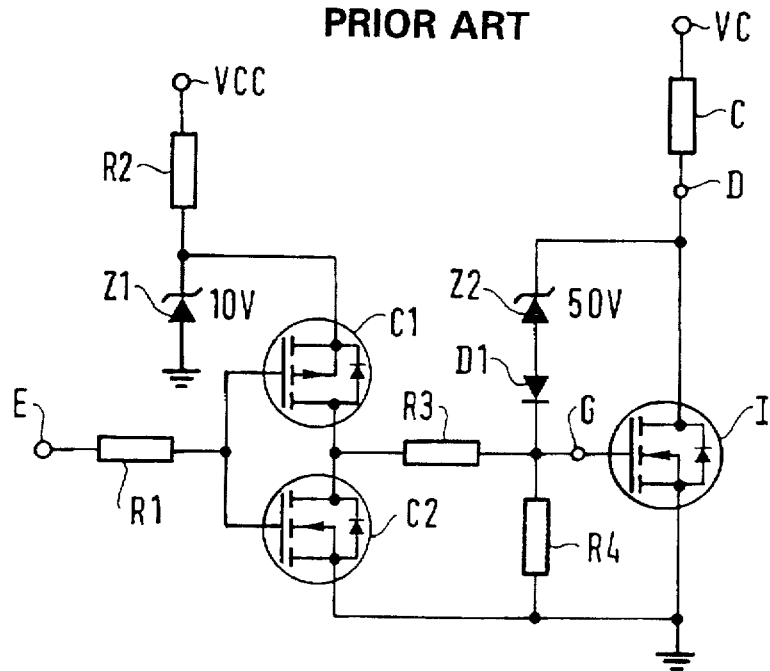
FIG. 1, already described above, is the theoretical diagram of a known type of control circuit for an electronic switch.
Figure 2:
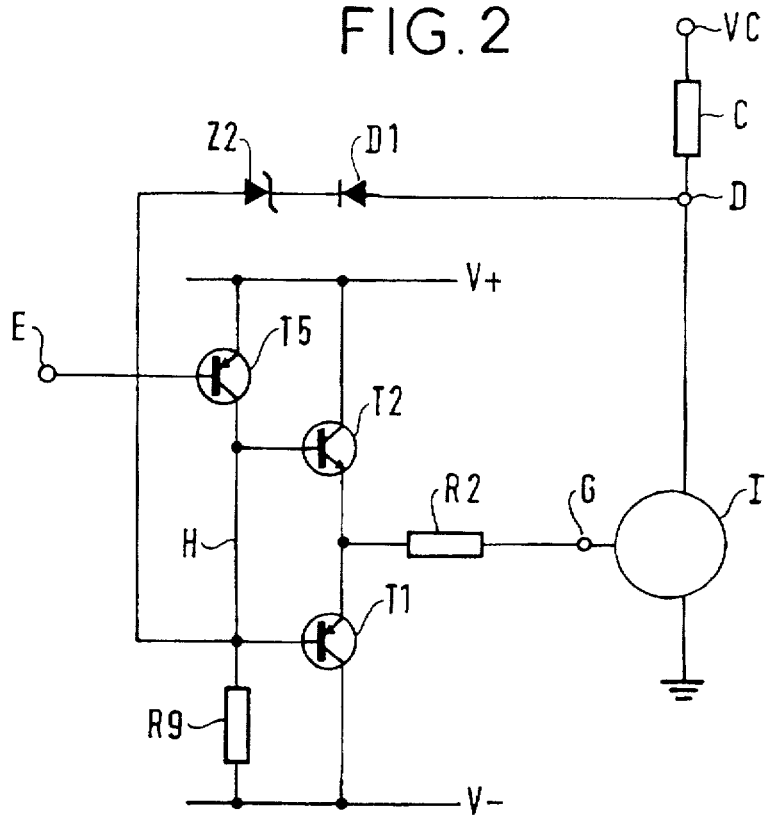
FIG. 2 is the theoretical diagram of a control circuit of the invention for an electronic switch.

In the diagram of FIG. 2, elements repeated from FIG. 1 with the same functions are given the same references.

Thus, there can be seen the switch control input E, the switch I, and the protection circuit which consists of the zener diode Z2 and the decoupling diode D1.

The input E is connected to the base of a PNP type control transistor T5 whose emitter is directly connected to the potential V+ while its collector is biased to the potential V− via a resistor R9. Transistor T5 directly controls the input H of a push-pull stage comprising two transistors, an NPN transistor T2, and a PNP transistor T1, analogous to the input stage of FIG. 1, that in turn controls the grid G of the switch I via resistor R2.

The protection circuit comprising the decoupling diode D1 and the zener diode Z2 is itself coupled to the control circuit of the switch I and is coupled more precisely to the input H of the push-pull stage, i.e.; to the bases of the transistors T2 and T1. It conveys current to the resistor R9, thereby developing a voltage which acts on the bases of the transistors T2 and T1, so as to make the transistor T2 conduct and so as to block the transistor T1, i.e. so as to cause the switch I to conduct.

This control circuit for the switch I operates as explained below.

When the potential of the input E becomes low enough relative to the potential V+, the control transistor T5 saturates and delivers the voltage V+, approximately, to the bases of the transistors T2 and T1. The transistor T2 saturates, thereby fixing the potential on the control grid of the switch I likewise to about V+. The resistance of resistor R2 may be freely determined for the sole purpose of matching the output of the push-pull stage to the input G of the switch I; in particular, its resistance may be as low as required. Given the reference potential relative to which the grid operates (e.g. substrate ground in a field effect device), the switch I whose grid is at a potential close to V+ then becomes conductive or non-conductive under optimum conditions. Power is fed to the load C, i.e. it is connected to ground, and this state is maintained so long as the input E remains at the same positive level.

When the input E is raised to the potential V+, control transistor T5 acts as a high impedance driving switch and isolates the bases of the transistors T2 and T1 from the potential V+. The charge present on the input capacitance of the switch I is evacuated to the potential V− via the transistor T1 which becomes conductive, thereby quickly and effectively blocking the switch I and isolating the load C from ground. The current gain of the transistors T2 and T1 may be very high (if necessary it is possible to use a Darlington pair for each of the transistors T2 and T1), such that the resistor R9 can have a very high resistance; the resistance of the resistor R2 does not matter.

However, at the same instant, the drop in current flowing through the load C gives rise to a surge at point D. This surge is generally due to the inductance of the conductors leading to the load C, wherein load C may itself be separately protected against surge, if the load C, is inductive. If the switch I has cutoff power which is high in terms of di/dt, then the surge will be correspondingly increased. Values can thus be reached that are liable to destroy the switch I.

As soon as the surge exceeds the total thresholds of the diodes D1 and Z2 plus the residual voltage across the terminals of the resistor R9, the zener diode Z2 becomes conductive and current is delivered to the bases of the transistors T2 and T1 thus switching on T2 and switching off T1, thereby bringing the switch I back into the conductive state, in the same manner as arises when current is delivered by the transistor T5 in response to a control signal on the input, E. In the same manner and just as efficiently as before, it prevents the current in the load C dropping off suddenly. The slope with which the current drops off therefore becomes linear, since the inductance of the circuit of the load C discharges at a constant voltage. By selecting an appropriate value for the threshold voltage of the zener diode Z2, the person skilled in the art can therefore ensure that this slope has the desired appearance and the resistance of resistor R9 will be selected to control the current flowing through D1, Z2, and R9 accordingly and to limit it to an acceptable value, without that affecting the control circuit of the switch I.

What is claimed is:

1. A control circuit for an electronic switch (I) powering a load (C) included in a load circuit, the control circuit comprising a control path for the electronic switch (I) that extends from a control signal input (E) to a control electrode (G) of the electronic switch (I), said control path comprising a push-pull input stage (T2, T1) whose input (H) is coupled to said control signal input (E) through a high impedance driving switch (T5), and whose output is coupled to the control electrode (G) of the electronic switch (I), and also comprising a protection circuit (D1, Z2) coupled between said load (C) and said control path, wherein the protection circuit comprises a threshold effect element (Z2) and a decoupling element (D1), through which flows a current resulting from a surge generated in the circuit of said load (C) so as to keep said electronic switch (I) conductive, the control circuit being characterized in that said protection circuit is coupled to the input (H) of said input stage (T2, T1) so as to act on said electronic switch (I) in the same manner as a control signal at said control signal input (E) for the electronic switch (I).

2. A control circuit according to claim 1, characterized in that said input of the input stage comprises an impedance (R9) whose value is such that it protects the elements of the protection circuit (Z2, D1).

\* \* \* \* \*